(12) United States Patent
Joshi et al.

(10) Patent No.: US 6,731,003 B2
(45) Date of Patent: May 4, 2004

(54) WAFER-LEVEL COATED COPPER STUD BUMPS

(75) Inventors: Rajeev Joshi, Cupertino, CA (US);
Consuelo Tangpuz, Lapu-Lapu (PH);
Erwin Victor R. Cruz, Koronadal (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/386,621

(22) Filed: Mar. 11, 2003

(65) Prior Publication Data

US 2003/0173684 A1 Sep. 18, 2003

Related U.S. Application Data

(60) Provisional application No. 60/363,789, filed on Mar. 12, 2002.

(51) Int. Cl.[7] .............................................. H01L 23/48
(52) U.S. Cl. ..................... 257/737; 257/783; 257/738
(58) Field of Search ............................... 257/737, 738, 257/783; 228/180.22; 438/613

(56) References Cited

U.S. PATENT DOCUMENTS

| | | | |
|---|---|---|---|
| 4,057,659 A | * 11/1977 | Pammer et al. ............... 427/91 |
| 5,637,916 A | 6/1997 | Joshi | |
| 5,765,280 A | 6/1998 | Joshi | |
| 5,789,809 A | 8/1998 | Joshi | |
| 5,895,231 A | * 4/1999 | Choi et al. .................. 438/106 |
| 5,977,783 A | * 11/1999 | Takayama et al. ............. 29/826 |
| 6,133,634 A | 10/2000 | Joshi | |
| 6,294,403 B1 | 9/2001 | Joshi | |
| 6,469,384 B2 | 10/2002 | Joshi | |
| 6,489,678 B1 | 12/2002 | Joshi | |
| 6,555,923 B2 | * 4/2003 | Sasaki ........................ 257/786 |
| 6,566,749 B1 | 5/2003 | Joshi et al. | |
| 6,590,287 B2 | * 7/2003 | Ohuchi ....................... 257/738 |
| 6,600,234 B2 | * 7/2003 | Kuwabara et al. .......... 257/790 |
| 2002/0056906 A1 | * 5/2002 | Kajiwara et al. ........... 257/697 |
| 2002/0063314 A1 | * 5/2002 | Huang et al. ............. 228/248.1 |
| 2002/0151164 A1 | * 10/2002 | Jiang et al. ................. 438/613 |
| 2002/0171157 A1 | * 11/2002 | Soga et al. .................. 257/783 |
| 2003/0000067 A1 | * 1/2003 | Hori .......................... 29/592.1 |
| 2003/0030149 A1 | * 2/2003 | Miura et al. ................. 257/772 |
| 2003/0042618 A1 | * 3/2003 | Nose et al. .................. 257/778 |

OTHER PUBLICATIONS

Standjord, et al. Low Cost Wafer Bumping Processes for Flip Chip Applications (Electroless Nickel–Gold/Stencil Printing), *IMAPS International Symposium on Microelectronics*, Chicago, Illinois, pp. 18–33, (Oct. 24–27, 1999).

* cited by examiner

*Primary Examiner*—Jasmine Clark
(74) *Attorney, Agent, or Firm*—Townsend and Townsend and Crew LLP

(57) ABSTRACT

A method for forming a semiconductor die package is disclosed. In one embodiment, the method includes forming a semiconductor die comprising a semiconductor device. A plurality of copper bumps is formed on the semiconductor die using a plating process. An adhesion layer is formed on each of the copper bumps, and a noble metal layer is formed on each of the copper bumps.

17 Claims, 2 Drawing Sheets

WAFER-LEVEL COATED COPPER STUD BUMPS

CROSS-REFERENCE TO RELATED APPLICATIONS

This application is a non-provisional of and claims the benefit of U.S. Patent Application No. 60/363,789, filed on Mar. 12, 2002. This U.S. Provisional Patent Application is herein incorporated by reference in its entirety.

BACKGROUND OF THE INVENTION

There are a number of ways to form conductive bumps on a semiconductor die.

One method includes the use of a bond on stitch ball (BSOB) wire bonding process. This technique is widely used for die to die bonding. It involves placing and bonding a gold ball bump at one end of a wire on a bond pad located on a silicon die. Another gold ball at the other end of the wire is bonded on a leadframe using ultrasonic energy, and then a wedge bonding process is performed on top of the gold bump.

There are some problems with the BSOB process. First, the BSOB process is slow and difficult to perform. Second, the high stress of the ball bumping process induces bond cratering. "Cratering" is a defect in which a portion of a die is torn loose by an excessive amount of ultrasonic wire-bonding energy. Third, it is difficult to consistently produce uniformly shaped gold balls.

Another method includes forming an impact cushioned copper stud bump on a silicon die. The impact cushioned copper stud bump prevents the silicon die from cracking during the copper stud bump forming process. This process uses a copper wire to form the copper stud bumps on the silicon die.

There are some problems associated with the impact cushioned copper stud bump process. First, like the above described gold ball process, this bumping process is slow and difficult to perform. Second, the copper stud that is formed is unprotected and is prone to oxidation. The presence of copper oxide in the copper stud bump increases the risk of excessive intermetallic compound formation when the copper stud is used with a lead-free solder.

Another method is described in Strandjord et al., "Low Cost Wafer Bumping Process for Flip Chip Applications (Electroless Nickel-Gold/Stencil Printing)". In this article, a low cost method of solder bumping wafers is described. A solderable electroless nickel film is deposited over an aluminum pad. Nickel is plated to a desired height, and the nickel layer is coated with a thin immersion layer of gold.

There are some problems with this low cost wafer bumping process. First, in this process, nickel is used as a bump material. Higher resistance is expected, since nickel has a higher electrical resistance than copper. Nickel is also harder than copper, and therefore the embodiments described in Strandjord et al. are more prone to bond cratering during wirebonding.

Embodiments of the invention address these problems and other problems.

SUMMARY OF THE INVENTION

Embodiments of the invention are directed to bumped semiconductor dies and methods for making bumped semiconductor dies.

One embodiment of the invention is directed to a method comprising: (a) forming a plurality of copper bumps on a semiconductor die using a plating process, wherein the semiconductor die comprises a semiconductor device; (b) forming an adhesion layer on each copper bump in the plurality of copper bumps; and (c) forming a noble metal layer on each copper bump in the plurality of copper bumps, wherein the adhesion layer is between the noble metal layer and the copper bump.

Another embodiment of the invention is directed to a method comprising: (a) forming a plurality of copper bumps on a semiconductor die using a plating process, wherein the semiconductor die comprises a semiconductor device; (b) forming an adhesion layer comprising nickel on each copper bump in the plurality of copper bumps; (c) forming an oxidation resistant layer comprising gold on each copper bump in the plurality of copper bumps, wherein the adhesion layer is between the oxidation resistant layer and the copper bump to form a coated copper bump; and (d) bonding the coated copper bump to a conductive region of a circuit substrate using solder.

Another embodiment of the invention is directed to a semiconductor die package comprising: (a) a semiconductor die comprising a semiconductor device; (b) a plated copper bump on the semiconductor die, the plated copper bump having a top surface; (c) an adhesion layer on at least the top surface; and (d) an oxidation resistant layer on the adhesion layer.

These and other embodiments of the invention are described in further detail below.

DETAILED DESCRIPTION

One embodiment of the invention is directed to a bumped semiconductor die. The semiconductor die comprises a semiconductor device. A plated copper bump is on the semiconductor die, and has a top surface. An adhesion layer is on at least the top surface of the plated copper bump, and an oxidation-resistant layer is on the adhesion layer. Together, the oxidation-resistant layer, the adhesion layer, and the plated copper bump can form a coated copper bump. There may be many coated copper bumps on the semiconductor die.

Figure 1:
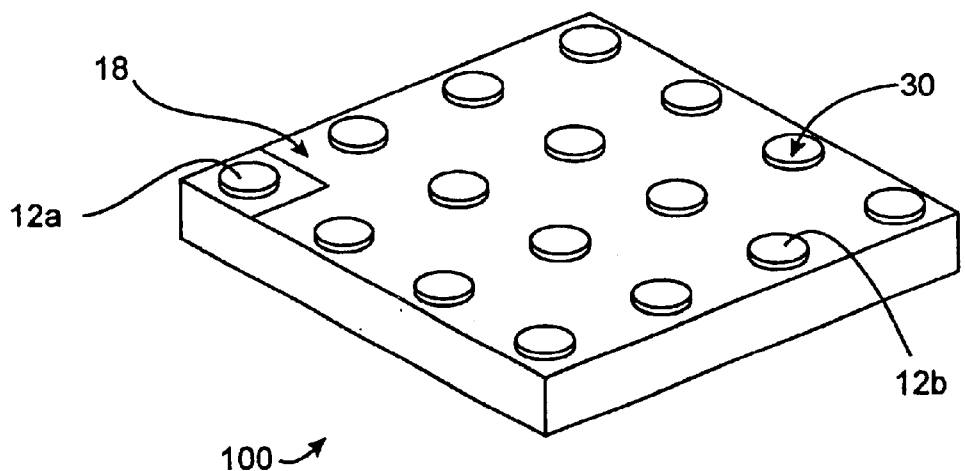
FIG. 1 shows a perspective view of a copper stud bumped semiconductor die according to an embodiment of the invention.
Figure 2:
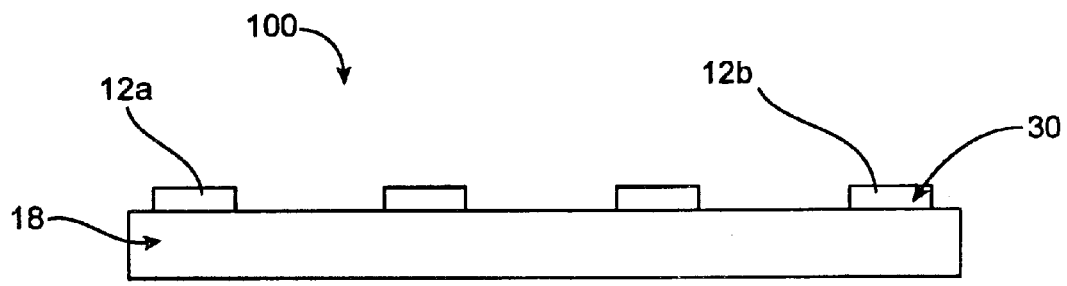
FIG. 2 shows a side view of the copper stud bumped semiconductor die shown in FIG. 1.

FIGS. 1 and 2 show a bumped semiconductor die 100 according to an embodiment of the invention. The bumped semiconductor die 100 includes a plurality of coated copper bumps 30 on a semiconductor die 18. Each coated copper bump 30 includes a plated copper bump, an adhesion layer, and an oxidation resistant layer. Each of the coated copper bumps 30 has a cylindrical shape in FIGS. 1 and 2, but the coated copper bumps could have other shapes in other embodiments of the invention.

The semiconductor die 18 may comprise any suitable material (e.g., silicon, gallium arsenide) and may include any suitable active or passive semiconductor device. For example, the semiconductor die may comprise a metal oxide field effect transistor (MOSFET) such as a power MOSFET. The MOSFET may have a planar or trenched gate. Trenched gates are preferred. Transistor cells containing trenched gates are narrower than planar gates. In addition, the MOSFET may be a vertical MOSFET. In a vertical MOSFET, the source region and the drain region are at opposite sides of the semiconductor die so that current in the transistor flows vertically through the semiconductor die. For example, referring to FIGS. 1 and 2, a coated copper bump 12(a) may correspond to a gate region of a vertical MOSFET in the semiconductor die 18, while the other coated copper bumps 12(b) may correspond to the source regions of the vertical MOSFET. The drain region of the MOSFET may be at the side of the semiconductor die 18 that is opposite the coated copper bumps 12(a), 12(b).

As will be described in further detail below, after it is formed, the bumped semiconductor die 100 can be further processed into a semiconductor die package that can be, for example, a BGA-type package or a package that uses bonding wires. In one example of a semiconductor die package, the bumped semiconductor die 100 can be mounted to a leadframe so that the drain region of a MOSFET in the semiconductor die contacts a die attach pad of the leadframe. Wires may be used to bond the coated copper bumps corresponding to the source and gate regions of the MOSFET to inner portions of various leads in the leadframe. Then, the wires, the bumped semiconductor die 100, and an inner portion of the leadframe may be encapsulated in a molding compound to form a semiconductor die package. In a second example of a semiconductor die package, the bumped semiconductor die 100 can be flipped over and can be mounted on a carrier substrate with solder to form a semiconductor die package. The carrier substrate may have any suitable number of input and output connections.

Figure 3:
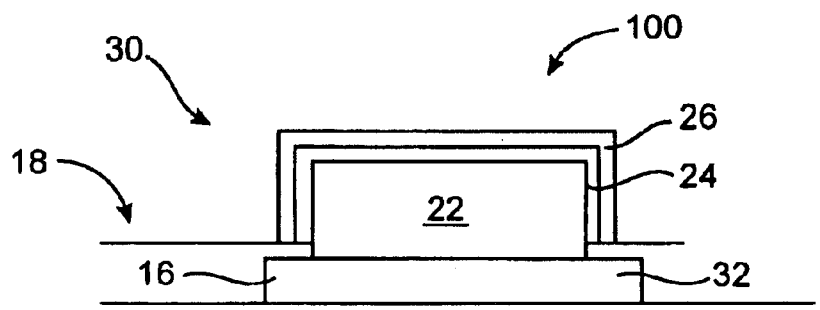
FIG. 3 shows a cross-sectional view of a coated copper stud bump.

FIG. 3 shows a coated copper bump 30 on a semiconductor die 18. A passivation layer 16 and a conductive pad 32 are present in the semiconductor die 18. The conductive pad 32 may comprise, for example, aluminum or an alloy thereof, while the passivation layer 16 may comprise any suitable dielectric material.

The coated copper bump 30 includes a plated copper bump 22, an adhesion layer 24, and an oxidation resistant layer 26. The adhesion layer 24 is between the oxidation resistant layer 26 and the plated copper bump 22. As shown in FIG. 3, the plated copper bump 22 may have a top surface and side surfaces. The adhesion layer 24 and the oxidation resistant layer 26 may cover at least the top surface of the plated copper bump 22. In FIG. 3, the adhesion layer 24 and the oxidation resistant layer 26 cover both the top surface and the side surfaces of the plated copper bump 22.

The plated copper bump 22 is formed using a plating process. Exemplary plating processes include electroplating or electroless plating. Suitable processing conditions for electroplating and electroless plating are known to those of ordinary skill in the art. The plated copper bump 22 can comprise a copper alloy or substantially pure copper. The plated copper bump 22 may be greater than about 25 microns thick (e.g., greater than about 30 or about 50 microns thick) in some embodiments.

The adhesion layer 24 may comprise a metal such as nickel (or an alloy of nickel), and the thickness of the adhesion layer may range from about 1 to about 4 microns in some embodiments. Other suitable materials that can be in the adhesion layer may include Cr, Ti, Ti/W, Pd, and Mo (and alloys thereof).

The oxidation resistant layer 26 may comprise a metal such as a noble metal (e.g., Au, Ag, Pd, Pt, and alloys thereof). In some embodiments, the oxidation resistant layer 26 may have a thickness between about 400 angstroms to about 2 microns. The oxidation resistant layer 26 is solderable and resists oxidation.

Figure 4:
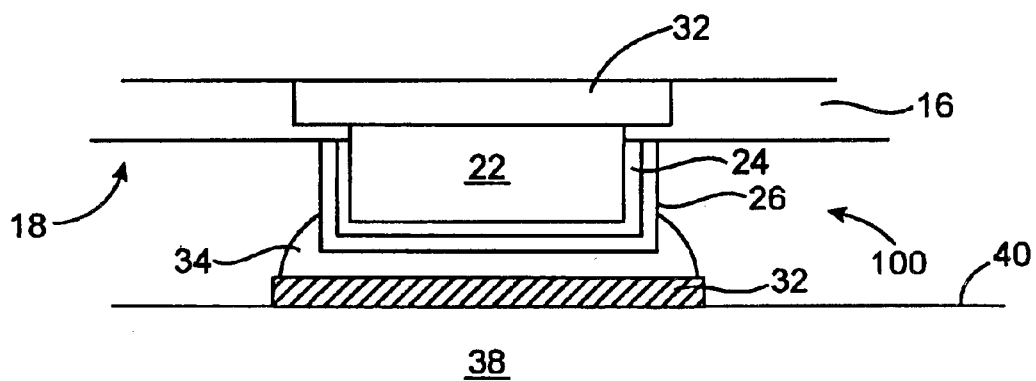
FIG. 4 shows a cross-sectional view of a coated copper stud bump that is connected to solder on a conductive region of a circuit substrate.

If the bumped semiconductor die 100 is to be used with a circuit substrate, the bumped semiconductor die 100 may be flipped over and mounted with solder to conductive regions of the circuit substrate. For example, referring to FIGS. 3 and 4, after the coated bump 30 is formed on the semiconductor die 18, the bumped semiconductor die 100 could be flipped over and then mounted to a circuit substrate 40, which can comprise a conductive region 32 and base 38. The base 38 could comprise one or more dielectric and conductive layers (not shown). The circuit substrate 40 could be a chip carrier or a printed circuit board. Solder 34 contacts the conductive region 32 and the coated copper bump 30.

In other embodiments, the bumped semiconductor die 100 could be mounted to a leadframe (not shown) using solder. The bottom of the bumped semiconductor die 100 could be mounted on a die attach pad of the leadframe, while input and output terminals on the top side of the bumped semiconductor die 100 are coupled to the inner portions of the leads of the leadframe (e.g., using gold wires). Then, the inner portion of the leadframe and bumped semiconductor die 100 could then be encapsulated with a molding compound to form a leaded semiconductor die package. The outer portions of the leads in the leadframe would extend laterally away from the molding compound. This is an example of a "leaded" semiconductor die package.

A method for forming the bumped semiconductor die 100 includes (a) forming a plurality of copper bumps on a semiconductor die using a plating process; (b) forming an adhesion layer on each copper bump in the plurality of copper bumps; and (c) forming an oxidation resistant layer on each copper bump in the plurality of copper bumps, wherein the adhesion layer is between the oxidation resistant layer and the copper bump.

In one exemplary process, a seed layer is deposited on a wafer comprising a plurality of semiconductor dies. Each semiconductor die can include semiconductor devices and aluminum bond pads. The bond pads can be exposed through apertures in a passivation layer. The semiconductor devices may comprise power MOSFETs (Metal Oxide Semiconductor Field Effect Transistors). A photoresist pattern is then formed on the wafer and exposes the aluminum bond pads in each of the semiconductor dies.

Copper bumps are then formed on the aluminum bond pads using an electroplating process (electroplating is known in the art). After copper bumps are formed, a blanket layer of an adhesion material such as nickel is formed on the wafer. This layer can be formed using evaporation, electroplating, electroless plating, sputtering, etc. As a result, an adhesion layer (e.g., between about 1–4 microns thick) comprising, for example, nickel is formed on each plated copper bump. Then, a blanket layer of an oxidation resistant material comprising, for example, gold is formed over the adhesion material. This layer may be formed using evaporation, electroplating, electroless plating, sputtering, etc. As a result, an oxidation resistant layer is formed over each plated copper bump. The thickness of the oxidation resistant layer is between about 400 angstroms and about 2 microns. The oxidation resistant layer on each plated copper bump is solderable and resists oxidation.

After the coated bumps are formed, the photoresist layer can be removed, and portions of the oxidation resistant layer, and portions of the adhesion layer around the plated copper bumps can be removed along with the removed photoresist. After removing the photoresist, the exposed portions of the previously deposited seed layer may then be flash etched. After flash etching, the wafer may be diced to form individual dies. Then, the individual semiconductor dies can be packaged as described above.

Other methods, including subtractive etching processes and photolithography can be used to form the bumped semiconductor die 100 shown in FIG. 3. Subtractive etching process and photolithography processes are well known to those of ordinary skill in the art, and are used to form conductive patterns. For example, a blanket adhesion layer may be deposited on a plurality of plated copper bumps, and the blanket adhesion layer may be processed using photolithography and etching processes known in the art to form individual adhesion layers on each plated copper bump.

Embodiments of the invention have advantages. Some embodiments of the invention can utilize a minimum of 30 microns of electroplated copper to form a copper stud bump. The plated copper stud bump can be directly attached to the aluminum metallization in a semiconductor die. It is then protected with two or more thin layers including, for example, nickel and gold. By using embodiments of the invention, difficult and slow wirebonding techniques such as BSOB could be eliminated, while still achieving lower on-resistance for a subsequently formed electronic package. The on-resistance or RdSon is the resistance associated with turning, for example, a MOSFET, on from an off state. In some embodiments, manufacturing speed can be increased by 36% or more as compared to a BSOB process. Also, a distribution of the coated copper stud bumps across the face of a semiconductor die would facilitate a lower sheet resistance as well as allow for precise bonding on areas of the semiconductor die. It would also allow the redistribution of current on the thin top metal layers, thereby reducing metal resistance and resulting in a lower RdSon for any subsequently formed package. The wafer-level copper stud bumps would also improve the manufacturability by improving a wire bond layout. Embodiments of the invention would also prevent or reduce the likelihood of silicon die cratering, since the coated copper stud bump will absorb most of the stress during any wirebonding process that might be used to form a semiconductor die package. Embodiments of the invention are also compatible with copper bonding, which is a cost saving opportunity. In addition, wafer-level copper stud bumps can be used as a platform for some solder bump applications (e.g., in a MOSFET BGA application). Moreover, the copper stud bumps provide a viable Pb-free solution for existing die packages, because the amount of lead that used in a package is reduced as compared to packages that use only solder to interconnect a semiconductor die with a leadframe or a circuit substrate.

Embodiments of the invention have a number of other advantages. First, embodiments of the invention do not use gold ball bumps made using a wirebonder. If a wirebonding process is used, a simpler wirebonding process can be used as compared to a process that does not use the coated copper stud bumps according to embodiments of the invention. Second, embodiments of the invention use electroplated copper. There is less stress on a die as compared to forming copper bumps using a wire-bonding process. In embodiments of the invention, if a wire-bonding process is used, most of the stress that is exerted is absorbed by the coated, copper stud bumps, rather than the semiconductor die itself. Third, the above-described wafer-level copper stud bump approach is flexible, and it can be used in conventional wirebonded packages as well as bumped packages. Fourth, copper is used as a bump material, and has a lower electrical resistance and is softer than, for example, nickel. This lowers the electrical resistance of a formed package and reduces the likelihood of cratering in a silicon die. Fifth, the adhesion layer on each copper bump prevents the copper bump from oxidizing. This reduces the likelihood of forming intermetallics if solder is used to join the copper bump to some other conductive region.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

All publications, patent applications, and patents mentioned above are herein incorporated by reference for all purposes. None is admitted to be "prior art".

What is claimed is:

1. A method comprising:
   (a) forming a plurality of copper bumps on a semiconductor die using a plating process, wherein the semiconductor die comprises a semiconductor device;
   (b) forming an adhesion layer on each copper bump in the plurality of copper bumps; and
   (c) forming an oxidation resistant layer on each copper bump in the plurality of copper bumps, wherein the adhesion layer is between the oxidation resistant layer and the copper bump.

2. The method of claim 1 wherein the semiconductor device is a power MOSFET (metal oxide semiconductor field effect transistor).

3. The method of claim 1 wherein the oxidation resistant layer and the adhesion layer coat a top surface and a side surface of each copper bump.

4. The method of claim 1 wherein each copper bump has a thickness greater than about 25 microns.

5. The method of claim 1 wherein the semiconductor die is in a semiconductor wafer, and wherein the method further comprises:
   dicing the semiconductor wafer to form individual semiconductor dies.

6. The method of claim 1 further comprising:
   packaging the semiconductor die after (c).

7. The method of claim 1 wherein the oxidation resistant layer comprises a noble metal.

8. The method of claim 1 wherein the oxidation resistant layer comprises a noble metal, and wherein the noble metal comprises gold or a gold alloy.

9. A method comprising:
   (a) forming a plurality of copper bumps on a semiconductor die using a plating process, wherein the semiconductor die comprises a semiconductor device;
   (b) forming an adhesion layer comprising nickel on each copper bump in the plurality of copper bumps;
   (c) forming an oxidation resistant layer comprising gold on each copper bump in the plurality of copper bumps, wherein the adhesion layer is between the oxidation resistant layer and the copper bump to form a coated copper bump; and (d) bonding the coated copper bump to a conductive region of a circuit substrate using solder.

10. The method of claim 9 wherein the semiconductor device comprises a vertical power MOSFET.

11. A bumped semiconductor die comprising:
   (a) a semiconductor die comprising a semiconductor device;
   (b) a plated copper bump on the semiconductor die, the plated copper bump having a top surface;
   (c) an adhesion layer on at least the top surface of the plated copper bump; and
   (d) an oxidation resistant layer on the adhesion layer.

12. The bumped semiconductor die claim 11 wherein the semiconductor device is a power MOSFET (metal oxide field effect transistor).

13. The bumped semiconductor die of claim 11 wherein the plated copper bump is electroplated.

14. The bumped semiconductor die of claim 11 wherein the adhesion layer comprises nickel and wherein the oxidation resistant layer comprises gold.

15. The bumped semiconductor die of claim 11 wherein the oxidation resistant layer comprises a noble metal.

16. The bumped semiconductor die of claim 11 wherein the semiconductor die includes a source region and a gate region at one side of the semiconductor die and a drain region at an opposite side of the semiconductor die.

17. A semiconductor die package comprising the bumped semiconductor die of claim 11.

* * * * *